(12) United States Patent
Takagi et al.

(10) Patent No.: US 6,316,967 B1
(45) Date of Patent: Nov. 13, 2001

(54) CURRENT DETECTOR

(75) Inventors: Kouichi Takagi; Takeshi Endoh, both of Nagoya (JP)

(73) Assignees: Autonetworks Technologies, Ltd., Nagoya; Sumitomo Wiring Systems, Ltd., Mie; Sumitomo Electric Industries, Ltd., Osaka, all of (JP)

( * ) Notice: Subject to any disclaimer, the term of this patent is extended or adjusted under 35 U.S.C. 154(b) by 0 days.

(21) Appl. No.: 09/692,144

(22) Filed: Oct. 20, 2000

(30) Foreign Application Priority Data

Oct. 27, 1999 (JP) .................................................. 11-305406

(51) Int. Cl.[7] .................................................. H03K 5/153
(52) U.S. Cl. .............................................. 327/50; 527/478
(58) Field of Search .................................... 327/50, 53, 72, 327/66, 391, 405, 432, 437, 478, 490, 374–377; 323/315

(56) References Cited

U.S. PATENT DOCUMENTS

| 5,627,490 | * | 5/1997 | Sushihara et al. | 327/510 |
| 5,926,062 | * | 7/1999 | Kuroda | 327/538 |
| 5,955,874 | * | 9/1999 | Zhou et al. | 327/542 |
| 6,166,529 | * | 12/2000 | Ikeuchi et al. | 323/315 |
| 6,201,381 | * | 3/2001 | Yasuda | 323/315 |

FOREIGN PATENT DOCUMENTS

| 5-208645 | 8/1993 | (JP) . |
| 5-74982 | 10/1993 | (JP) . |
| 9-74666 | 3/1997 | (JP) . |

* cited by examiner

*Primary Examiner*—My-Trang Nu Ton
(74) *Attorney, Agent, or Firm*—Oliff & Berridge, PLC

(57) ABSTRACT

When a circuit is activated, bases of transistors Q1 and Q2 making up a first current mirror circuit 7 are grounded through switch means 10, whereby a current is forcibly made to flow into the bases of the transistors Q1 and Q2. Thus, the circuit operation can be made reliable at the activation time. A part of load current is shunted with good accuracy via a resistor R1 having a first resistance value of a predetermined magnification of a resistance value of a shunt resistor Rs, the first current mirror circuit 7, and a second current mirror circuit 8, and the output end of the shunted current is grounded via a resistor R2 having a second resistance value, so that an output voltage VOUT proportional to a load current IL can be obtained with good accuracy from the resistor R2 and the load current IL can be found with good accuracy from the output voltage VOUT.

18 Claims, 9 Drawing Sheets

CURRENT DETECTOR

BACKGROUND OF THE INVENTION

This invention relates to a current detector for detecting a supply current supplied to a load with good accuracy.

Hitherto, a high-accuracy current detector has been demanded for the purposes of finding the charge amount of a secondary battery used with a personal computer, etc., with good accuracy, monitoring a current distribution circuit in an automobile, etc. A method of placing a shunt resistor of a high-accuracy low resistance element in series with wiring through which the current to be detected flows and detecting a voltage drop occurring in the shunt resistor, thereby detecting a current value is known.

For example, in FIG. 10, a current I12 proportional to a load current IL flowing into a shunt resistor Rs is formed using pnp transistors Q11 and Q12 and a resistor R11 and is converted into an output current VOUT using a resistor R12, thereby detecting the load current IL.

Hitherto, a method of using an operational amplifier IC to differentially amplify the potential difference occurring across a shunt resistor of a high-accuracy low resistance element and output the voltage proportional to a load current has been known. In this case, however, the offset voltage of the operational amplifier IC is superposed on the output voltage, thus a problem is involved in the accuracy particularly when the load current is small. In contrast, there is also an operational amplifier IC whose output voltage can be adjusted by connecting a variable resistor to an external terminal, but the operational amplifier ICs are not suitable for mass production. A method of canceling the effect of offset voltage by a circuit shown in FIG. 11 is known.

In FIG. 11, if an operational amplifier OP1 has a sufficiently large amplification factor, the potential difference between an inversion input terminal and a noninversion input terminal of the operational amplifier OP1 can be assumed to be zero. Therefore, $$I14 \cdot R14 = (I13 + IL) \cdot RS \approx IL \cdot RS$$

where R14 is the resistance value of a resistor R14, RS is the resistance value of a shunt resistor Rs, I13 is a current flowing into the inversion input terminal of the operational amplifier OP1, and I14 is a current flowing into the noninversion input terminal of the operational amplifier OP1.

Thus, the collector current I14 of a pnp transistor Q13 becomes $$I14 \approx I1 \cdot RS/R14$$

and a current proportional to load current IL can be output.

However, in the circuit previously described with reference to FIG. 10, the range in which the voltage proportional to the load current IL flowing into the shunt resistor Rs of a high-accuracy low resistance element is provided is narrow, thus to monitor a small current area and to monitor a large current area, different circuits need to be used, for example, in such a manner that the resistance value of the resistor R12 is changed; this is a problem. In [DETAILED DESCRIPTION OF THE PREFERRED EMBODIMENTS] covered later, using FIG. 3, comparison with the circuit forming the invention is made for the relationship between the load current and the output voltage in the circuit in FIG. 10.

Use of the circuit previously described with reference to FIG. 11 using the operational amplifier IC requiring a large number of circuit elements is not preferred considering implementing of the current detection circuit in IC form, the manufacturing costs, etc.

SUMMARY OF THE INVENTION

It is therefore an object of the invention to provide a current detector having a simple configuration capable of detecting a current with good accuracy.

According to a the invention, there is provided a current detector using a current detection resistor placed between a power supply section and a load to detect a supply current value supplied from the power supply section to the load, the current detector comprising a first resistance element having a first resistance value of a predetermined magnification of a resistance value of the current detection resistor, a first current mirror circuit made up of a plurality of negative-polarity-type transistors and having one end connected to an end part of the current detection resistor on the power supply section side thereof via the first resistance element and an opposite end connected to an end part of the current detection resistor on the load side thereof, a second current mirror circuit made up of a plurality of positive-polarity-type transistors and having both input ends connected to both output ends of the first current mirror circuit, a second resistance element placed between at least either of both output ends of the second current mirror circuit and ground and having a second resistance value, and current detection means for detecting a voltage of the second resistance element on the second current mirror circuit 8 side thereof, characterized by switch means being placed between control terminals of the transistors making up the first current mirror circuit and ground. Preferably, the current detector of the invention further includes current value detection means using the detected voltage to find the supply current value. Here, the negative-polarity-type transistors are transistors (current control elements) such as pnp transistors and p-channel FETs (field-effect transistors) of the type wherein when a current is drawn out from a control terminal, current terminals are brought into conduction, and the positive-polarity-type transistors are transistors (current control elements) such as npn transistors and n-channel FETs of the type wherein when a current is input to a control terminal, current terminals are brought into conduction. The control terminals of the transistors making up the second current mirror circuit are connected to one input end of the second current mirror circuit and the control terminals of the transistors making up the first current mirror circuit are connected to an opposite input end of the second current mirror circuit.

According to the configuration, when the circuit is activated, the control terminals of the transistors making up the first current mirror circuit are grounded through the switch means, whereby a current is forcibly made to flow into the control terminals, so that it is made possible to make the circuit operation at the activation time reliable. A part of load current is shunted with good accuracy via the first resistance element having the first resistance value of the predetermined magnification of the resistance value of the current detection resistor, the first current mirror circuit, and the second current mirror circuit, and the output end of the shunted current is grounded via the second resistance element having the second resistance value, so that an output voltage proportional to the load current can be obtained with good accuracy from the second resistance element in a simple configuration and the load current can be found with good accuracy from the output voltage.

Preferably, in the current detector of the invention, the switch means comprises a transistor circuit capable of grounding the control terminal of the transistor.

According to the configuration, the switch means can be easily implemented as transistor circuit.

Preferably, in the current detector of the invention, the switch means comprises a one-shot pulse generation circuit for activating the transistor circuit.

According to the configuration, a one-shot pulse from the one-shot pulse generation circuit can be used easily to turn off the transistor circuit after turning on the transistor circuit only for a predetermined time.

Preferably, the current detector of the invention further includes control means for controlling so that the voltage detection means detects the voltage after on/off control of the switch means is performed (in the embodiment, control means 11 or microcomputer 11a). Preferably, the current detector of the invention further includes control means for controlling so as to output a current detection start signal to the voltage detection means after on/off control of the switch means is performed (in the embodiment, control means 11).

According to the configuration, it is made possible to take the voltage detection timing reliably and well.

Preferably, in the current detector of the invention, the control means controls so as to detect the voltage every constant period and performs on/off control of the switch means every constant period while the voltage is not detected.

According to the configuration, on/off control of the switch means is performed every constant period. Thus, if the current voltage conversion circuit made up of the first and second current mirror circuits malfunctions and stops due to noise, etc., for example, it is again activated in the next period and the detected voltage can always be monitored. Therefore, noise resistance of the first and second current mirror circuits is enhanced.

Preferably, in the current detector of the invention, the first current mirror circuit comprises a first transistor having an emitter connected to the power supply section side of the current detection resistor via the first resistance element and a second transistor having an emitter connected to the load side of the current detection resistor and a base and a collector connected to a base of the first transistor, the first and second transistors being implemented as pnp transistors, the second current mirror circuit comprises a third transistor having a collector connected to a collector of the first transistor and a fourth transistor having a collector connected to the collector of the second transistor and a base connected to a base and the collector of the third transistor, the third and fourth transistors being implemented as npn transistors, and an emitter of at least either of the third and fourth transistors is grounded via the second resistance element.

According to the configuration, the first and second current mirror circuits can be configured more easily.

Preferably, the current detector of the invention further includes a third resistance element having the second resistance value, a fourth resistance element having the same resistance value as the first resistance element, and a fifth resistance element having a resistance value different from the second resistance value, wherein the first current mirror circuit further includes a fifth transistor of a pnp transistor having an emitter connected to the power supply section side of the current detection resistor via the fourth resistance element and a base connected to the base of the first transistor, wherein the third transistor has the emitter grounded via the second resistance element, the fourth transistor has the emitter grounded via the third resistance element, and the fifth transistor has a collector grounded via the fifth resistance element, and wherein the voltage detection means further detects a voltage value of the collector of the fifth transistor.

According to the configuration, if the voltage of the second resistance element on the second current mirror circuit side thereof and the voltage of the fifth resistance element on the fifth transistor side thereof are changed in response to the change range of the detected voltage caused by change in the load current and the voltage is detected, the load current can be found suitable with good accuracy if the voltage range that can be detected by the voltage detection means is narrow as compared with the change range of the detected voltage caused by change in the load current. Also in this case, it is made possible to make the circuit operation at the activation time reliable by the switch means.

Preferably, the current detector of the invention further includes a predetermined number of sixth resistance elements each having the second resistance value, wherein the first current mirror circuit has the predetermined number of sixth transistors of pnp transistors having emitters connected to the emitter of the first transistor and bases connected to the base of the first transistor, and wherein collectors of the sixth transistors are grounded via the sixth resistance elements.

According to the configuration, the currents flowing into the second resistance element and the sixth resistance elements become equal levels to each other, thus the detected voltage becomes low and the voltage detection means can be made up of circuit parts consuming low power and the circuit can be miniaturized and the costs can be reduced. Also in this case, it is made possible to make the circuit operation at the activation time reliable by the switch means.

DETAILED DESCRIPTION OF THE PREFERRED EMBODIMENTS

Figure 1:
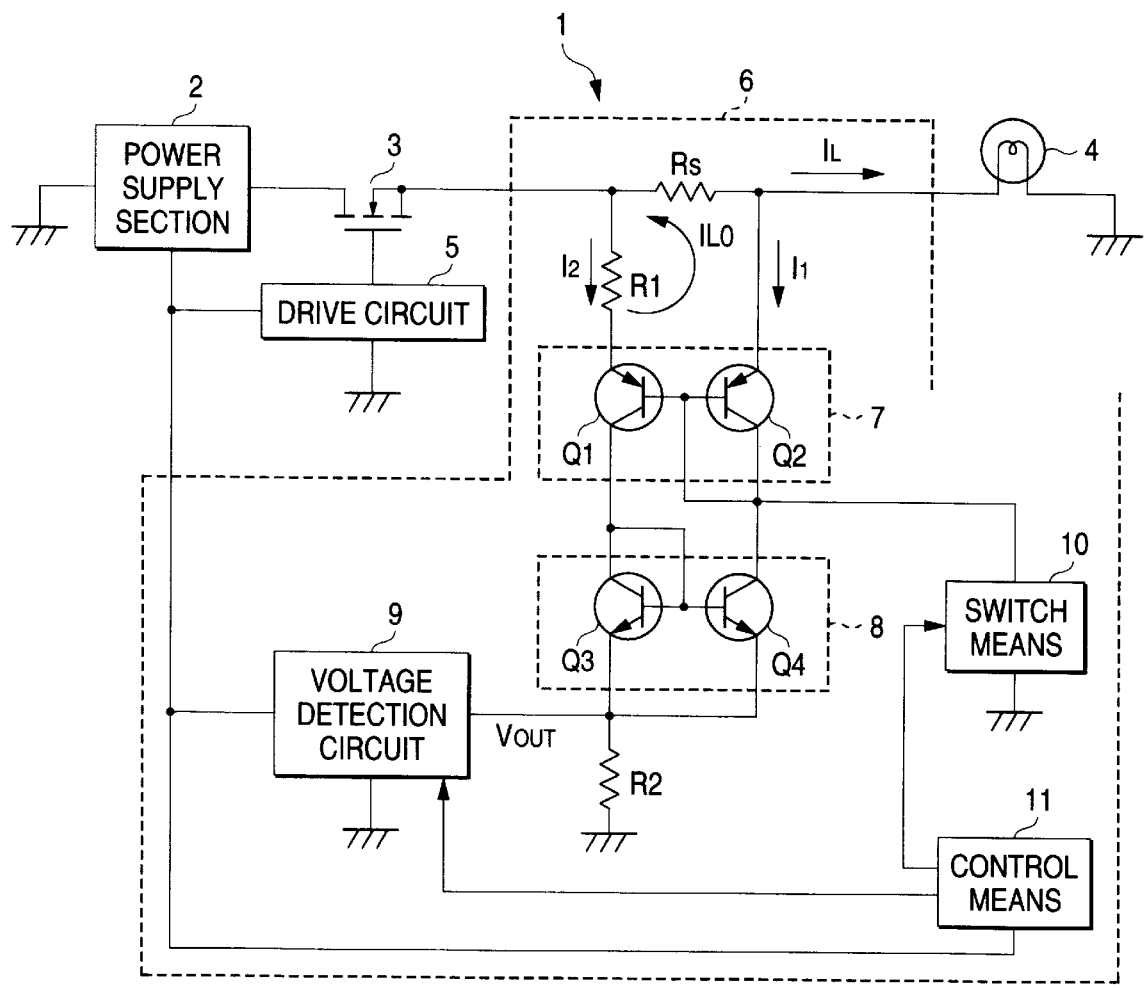
FIG. 1 is a diagram to show the configuration of a current supply unit containing a current detector of one embodiment of the invention.

FIG. 1 is a diagram to show the configuration of a current supply unit containing a current detector of one embodiment of the invention. In FIG. 1, a current supply unit 1 comprises an FET 3 for current supply and a load 4 connected in series between a power supply section 2 and ground, wherein the FET 3 is controlled based on a drive current from a drive circuit 5 for supplying a load current IL from the power supply section 2 to the load 4. A current detector 6 is placed between the FET 3 and the load 4 for detecting the load current IL supplied from the power supply section 2 to the load 4.

The current detector 6 comprises a shunt resistor Rs (current detection resistor) placed between the FET 3 and the load 4, a resistor R1 (first resistance element) connected to the FET 3 side of the shunt resistor Rs, a first current mirror circuit 7, a second current mirror circuit 8, a resistor R2 (second resistance element) placed between both output ends of the second current mirror circuit 8 and ground, and a voltage detection circuit 9 for detecting an output voltage VOUT of the resistor R2 on the second current mirror circuit 8 side thereof and using the output voltage VOUT to determine whether or not the load current is within the normal range, and converts a current proportional to the load current IL into a voltage with the resistor R2 from the shunt resistor Rs through the first current mirror circuit 7 and the second current mirror circuit 8, and the voltage detection circuit 9 detects the voltage. The current detector 6 further comprises switch means 10 placed between control terminals (bases) of transistors making up the first current mirror circuit 7 and ground and control means 11 for controlling so as to cause the voltage detection circuit 9 to output a voltage detection start signal after the switch means 10 is turned on/off.

The shunt resistor R2 is a high-accuracy low resistance element having a known resistance value RS and provides a current detection resistor. The resistor R1 has a first resistance value of a predetermined magnification of the resistance value of the shunt resistor Rs.

The first current mirror circuit 7 has one input end connected to one end of the shunt resistor Rs on the power supply section 2 side thereof via the first resistance element and an opposite input end connected to one end of the shunt resistor Rs on the load 4 side thereof. Specifically, the first current mirror circuit 7 is made up of a transistor Q1 (first transistor) and a transistor Q2 (second transistor) which are pnp transistors having the same transistor characteristic. The transistor Q1 has an emitter connected to the power supply section 2 side of the shunt resistor Rs via the resistor R1 and a base connected to a base and a collector of the transistor Q2 and the transistor Q2 has an emitter connected to the load 4 side of the shunt resistor Rs. The emitter sides of the transistors Q1 and Q2 form both input ends of the first current mirror circuit 7 and the collector sides of the transistors Q1 and Q2 form both output ends of the first current mirror circuit 7.

The second current mirror circuit 8 is made up of a transistor Q3 (third transistor) and a transistor Q4 (fourth transistor) which are npn transistors having the same transistor characteristic. The transistor Q3 has a collector connected to the collector of the first transistor Q1 and a base connected to the collector of the transistor Q3 and a base of the transistor Q4 and the transistor Q4 has a collector connected to the collector of the transistor Q2. The collector sides of the transistors Q3 and Q4 form both input ends of the second current mirror circuit 8 and the emitter sides of the transistors Q3 and Q4 form both output ends of the second current mirror circuit 8.

In the circuitry in FIG. 1, the transistor group T1 consisting of the pnp transistors Q1 and Q2 and the transistor group T2 consisting of the npn transistors Q3 and Q4 have the same transistor characteristics such that the base-emitter voltage Vbe difference can be almost ignored by using adjacent transistors on the same semiconductor wafer, etc.

For example, to make up a circuit of discrete parts, one package housing two adjacent transistors is commercially available and thus may be used. To use an IC, transistors Q1 and Q2 are placed adjacent to each other and transistors Q3 and Q4 are placed adjacent to each other on semiconductor wafer, whereby the base-emitter voltage Vbe difference can be placed at a level to such an extent that it can be almost ignored.

The resistor R2 has a second resistance value and is placed between the emitters of the transistors Q3 and Q4 and ground.

The voltage detection circuit 9 forms voltage detection means for detecting the output voltage VOUT of the emitters of the transistors Q3 and Q4. It also forms load current determination means (current value detection means) for using the detected voltage value to determine whether or not the load current IL is within the normal range. Specifically, for example, if the voltage detection circuit 9 is implemented as one comparator, the comparator can compare the output voltage VOUT with the reference voltage (lower or upper limit reference voltage) and whether or not the load current IL is within the normal range can be determined by output of the comparator. If the voltage detection circuit 9 is made up of two comparators, the first comparator can compare the output voltage VOUT with the lower limit reference voltage and whether or not the load current IL is within the lower limit range can be determined by output of the first comparator. The second comparator can compare the output voltage VOUT with the upper limit reference voltage and whether or not the load current IL is within the upper limit range can be determined by output of the second comparator. Outputs of the first and second comparators can be input to an AND gate and whether or not the load current IL is within the normal range can be determined by output of the AND gate.

Figure 2:
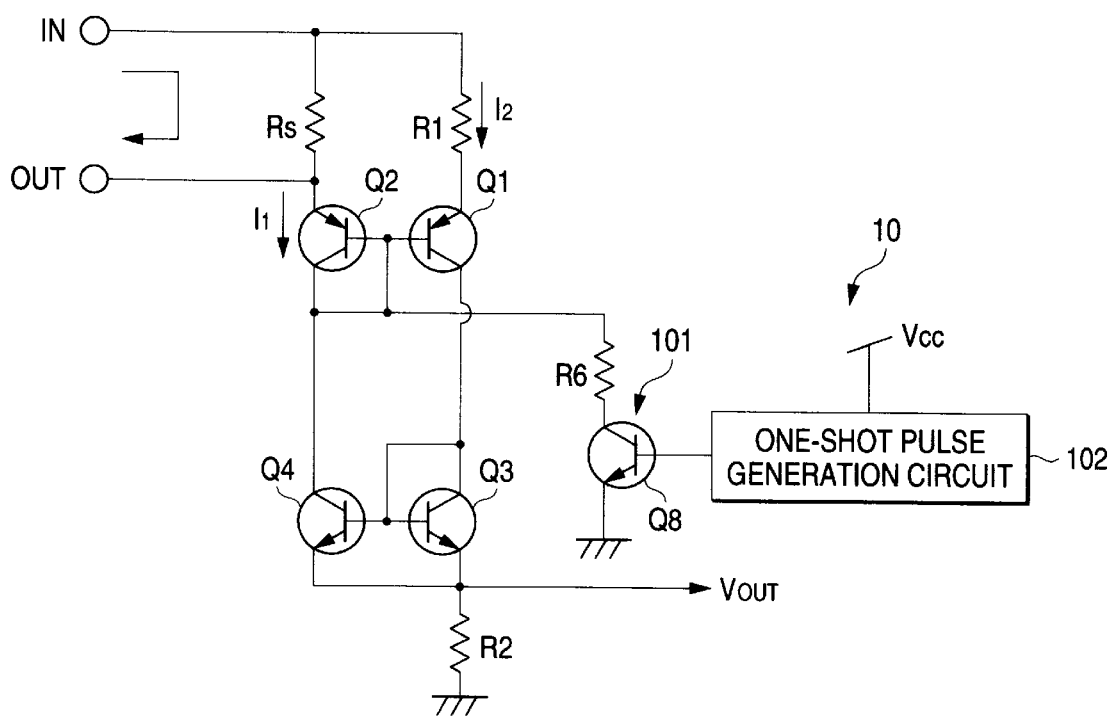
FIG. 2 is a diagram to show the configuration of switch means in FIG. 1.

The switch means 10 has a transistor circuit 101 and a one-shot pulse generation circuit 102 for activating the transistor circuit 101, as shown in FIG. 2.

The transistor circuit 101 comprises a transistor Q8, which has a collector connected via a resistor R6 to the bases of the transistors Q1 and Q2 and an emitter grounded. The one-shot pulse generation circuit 102 has an output end connected to a base of the transistor Q8 and outputs a one-shot pulse of a predetermined duration to the base of the transistor Q8 as a trigger signal is input to an input end of the one-shot pulse generation circuit 102. Power supply Vcc is supplied to the one-shot pulse generation circuit 102 from the power supply section 2.

The control means 11 controls so as to output a trigger signal as a circuit drive signal to the one-shot pulse generation circuit 102 only once when the power is turned on and after the expiration of a predetermined time, the control means 11 controls so as to output a drive start signal of the voltage detection circuit 9.

The reason why the switch means 10 is provided is as follows: If a route where a base current flows into the base of the transistor Q1 or Q2 does not exist, the circuit does not operate. If the switch means 10 is not provided, the first current mirror circuit 7 and the second current mirror circuit 8 can operate, but the stability of the operation is not sufficient. That is, in the actual circuit operation, current IL0 shown in FIG. 1 flowing because of a voltage drop occurring in the shunt resistor Rs causes the transistor Q1 to allow a collector current to flow, which then becomes a base current of the transistors Q3 and Q4 at the following stage, and currents I1 and I2 flow into the first current mirror circuit 7 and the second current mirror circuit 8. Since the currents also flow via the base-emitter parasitic capacitance of the transistor Q2, the first current mirror circuit 7 and the second current mirror circuit 8 operate. Alternatively, the circuit may operate due to the collector leakage current of each transistor. Thus, the above-described circuit operation is realized based on the internal structure (parasitic capacitance) of each of the actual transistors and the stable operation is not reliably performed depending on the combination of the transistors and the circuit constants. A malfunction caused by noise or temperature change (circuit stop caused by parasitic capacitance change, etc.,) can also occur. Therefore, to perform the stable circuit operation reliably, the circuit is grounded via the switch means 10 when the circuit is started, whereby the route where the base current flows into the bases of the transistors Q1 and Q2 is forcibly provided.

Next, the reason why driving the voltage detection circuit 9 is started after the expiration of the predetermined time since driving the transistor circuit 101 is as follows:

As the transistor Q8 is turned on, the base current is made to flow into the bases of the transistors Q1 and Q2 and the first current mirror circuit 7 and the second current mirror circuit 8 are forcibly operated. When the transistor Q8 is on, the bases of the transistors Q1 and Q2 are grounded, thus voltage not related to the load current IL (voltage not proportional to the load current IL) is output as the output voltage VOUT. Thus, while the transistor Q8 is on, the output voltage VOUT is not monitored by the voltage detection circuit 9. Then, if the transistor Q8 is turned off, the currents I1 and I2 continue to flow because of the sol-called self-hold circuit function, so that the first current mirror circuit 7 and the second current mirror circuit 8 continue to operate and the output voltage VOUT proportional to change in the load current IL is provided.

Next, the principle of finding the load current IL from the output voltage VOUT in the current value detection means will be discussed. First, the resistor R1 having resistance value R1 N times the resistance value RS of the shunt resistor Rs (predetermined magnification) as shown in the following expression 1 is adopted:
(Expression 1)

$$R1 = N \cdot RS$$

The following expression 2 is obtained for the potential difference between the bases of the transistors Q1 and Q2 and the source of the FET 3:
(Expression 2)

$$I2 \cdot R1 + Vbe(Q1) = (I1 + IL) \cdot RS + Vbe(Q2)$$

where I1 is the collector current flowing into the transistor Q2, I2 is the collector current flowing into the transistor Q1, Vbe (Q1) is the base-emitter voltage of the transistor Q1, and Vbe (Q2) is the base-emitter voltage of the transistor Q2, as shown in FIG. 1.

Since the transistors Q1 and Q2 adopt transistors of almost the same characteristic, as described above, the following expression 3 is obtained:
(Expression 3)

$$Vbe(Q1) = Vbe(Q2)$$

When the expressions 1 and 3 are assigned to the expression 2, the following expression 4 is obtained:
(Expression 4)

$$I2 = (I1 + IL)/N$$

In the circuitry in FIG. 1, the transistors Q3 and Q4 make up so-called current mirror circuit. In the current mirror circuit, the common emitter resistor R2 is connected and the transistors of almost the same characteristic are adopted as described above, so that the base-emitter voltages equal and therefore the following expression 5 is obtained:
(Expression 5)

$$IC(Q3) = IC(Q4)$$

where IC(Q3) is the collector current flowing into the transistor Q3 and IC(Q4) is the collector current flowing into the transistor Q4.

Generally, hFE=(collector current)/(base current) of transistor is sufficiently large, thus the emitter current and the collector current of each transistor can be assumed to be equal, and the following expressions 6, 7, and 8 are obtained:
(Expression 6)

$$IC(Q3) = I2$$

(Expression 7)

$$IC(Q4) = I1$$

(Expression 8)

$$IC(Q3) = IE(Q3)$$

$$IC(Q4) = IE(Q4)$$

Therefore, from the expressions 5, 6, and 7,
(Expression 9)

$$I2 = I1$$

Therefore, from the expressions 4 and 9,
(Expression 10)

$$I2 = I1 = IL/(N-1)$$

From the expressions 6 and 8,
(Expression 11)

$$I2 = IE(Q3)$$

Therefore, from the expressions 10 and 11, the output voltage VOUT to the voltage detection circuit 9 is
(Expression 12)

$$VOUT = 2 \cdot R2 \cdot I1$$

$$= 2 \cdot R2 \cdot IL/(N-1)$$

Since the resistance value R2 of the resistor R2 and the numeric value N are known, in the voltage detection circuit 9
(Expression 13)

$$IL = VOUT \cdot (N-1)/(2 \cdot R2)$$

Thus, the load current IL can be found.

For example, assuming that RS=10 (mΩ), R1=1 (kΩ), and R2=33 (kΩ), VOUT=2 (V) when IL=3 (A).

The operation of the circuitry having the configuration described above is as follows: First, when the power is turned on, the power supply section 2 is driven, driving the drive circuit 5 is also started, and driving the control means 11 is also started. When the drive circuit 5 is driven, the FET 3 is turned on and the load current IL is supplied to the load 4 via the shunt resistor Rs. When the control means 11 is driven, it outputs a trigger signal to the one-shot pulse generation circuit 102 and upon reception of the trigger signal, the one-shot pulse generation circuit 102 outputs a one-shot pulse to the base of the transistor Q8, whereby the transistor Q8 is turned on only for a predetermined time, the bases of the transistors Q1 and Q2 are grounded, a base current flows into the bases of the transistors Q1 and Q2, and the first current mirror circuit 7 and the second current mirror circuit 8 are forcibly operated.

Next, although the transistor Q8 is turned off, currents I1 and I2 continue to flow into the first current mirror circuit 7 and the second current mirror circuit 8, so that the first current mirror circuit 7 and the second current mirror circuit 8 continue to operate and the output voltage VOUT as current voltage conversion output proportional to change in the load current IL is provided.

At this point in time, the control means 11 controls so as to output a drive start signal of the voltage detection circuit 9, and the voltage detection circuit 9 monitors and detects the output voltage VOUT.

Further, the voltage detection circuit 9 finds the load current IL from the detected output voltage VOUT by the load current determination means and determines whether or not the load current IL is within the normal range. Determination display can be produced and the value of the load current IL can be displayed in response to the determination result.

Figure 3A:
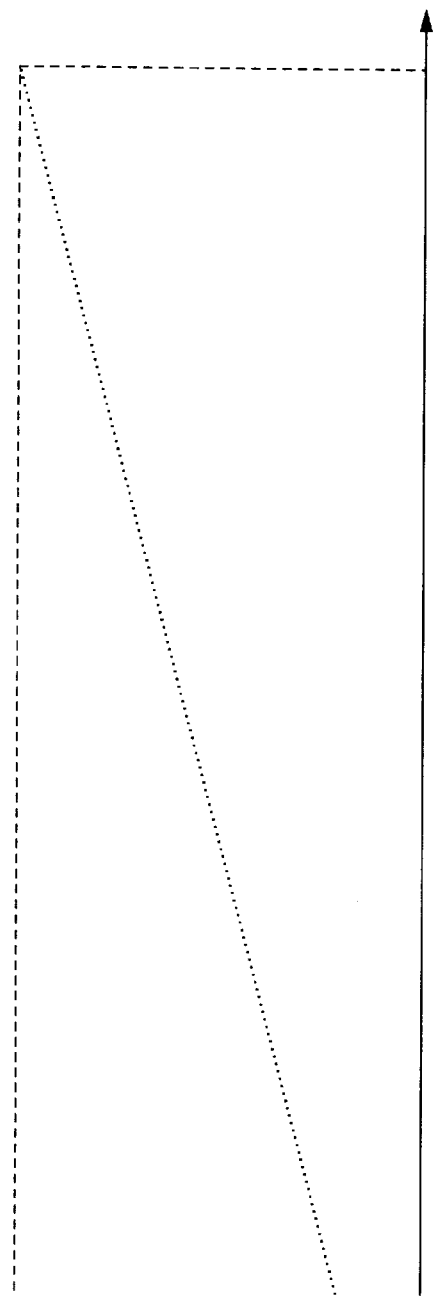
FIG. 3A is a drawing to show change in a load current IL from 5 (A) to 50 (A)
Figure 3B:
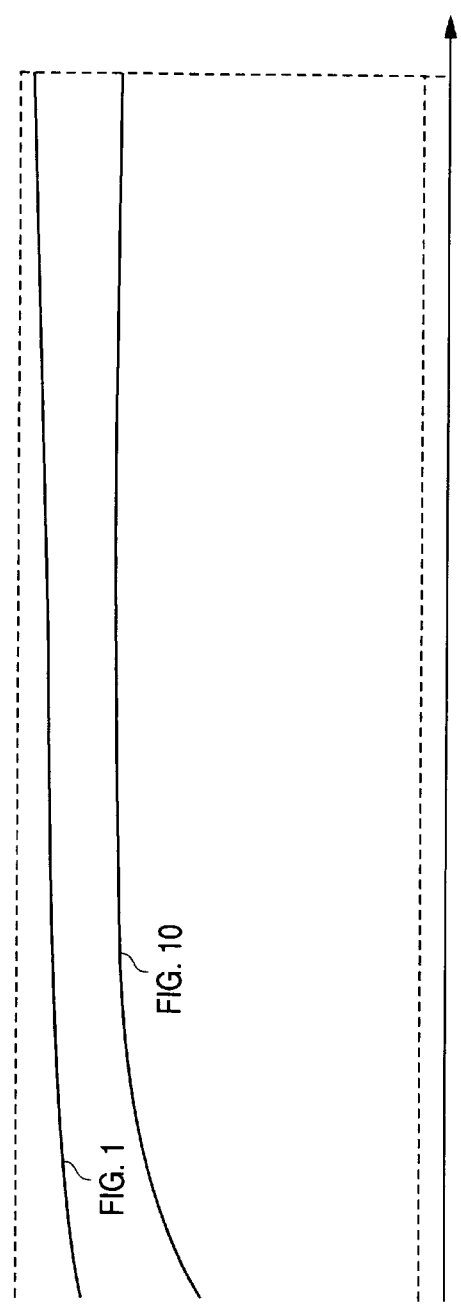
FIG. 3B is a comparison drawing of change in (load current IL)/(output voltage VOUT) between the circuits in FIGS. 1 and 10 when the load current IL changes as in FIG. 3A.

FIG. 3A is a drawing to show change in the load current IL from 5 (A) to 50 (A) and there are no units on the horizontal axis. FIG. 3B is a comparison drawing of change in (load current IL)(output voltage VOUT) between the circuits in FIGS. 1 and 10 when the load current IL changes as in FIG. 3A.

Figure 10:
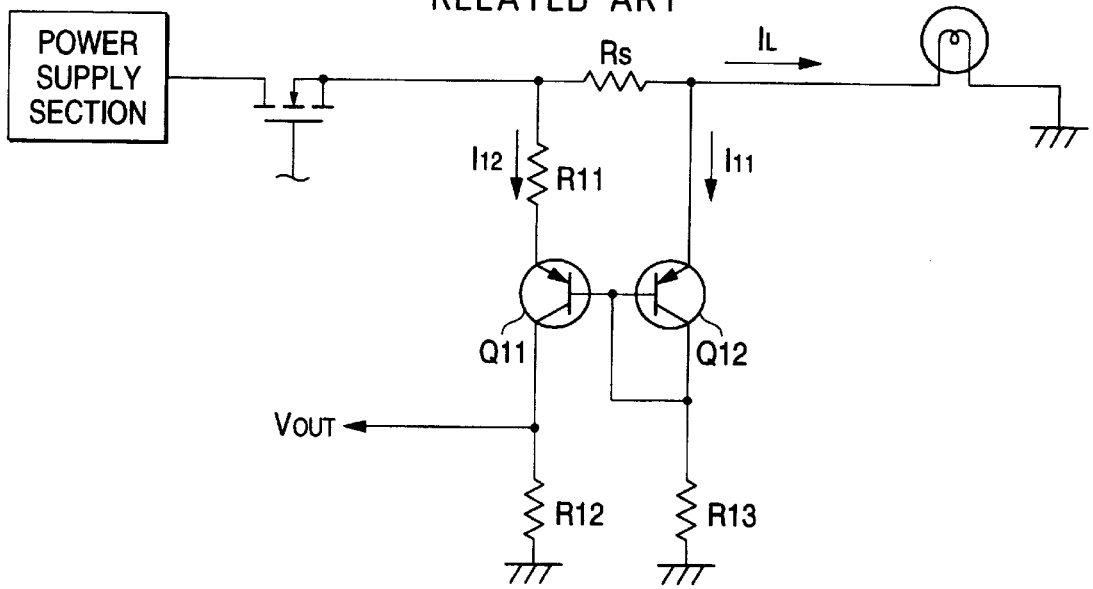
FIG. 10 is a circuit diagram to show an example of a current detection circuit in a related art.
Figure 11:
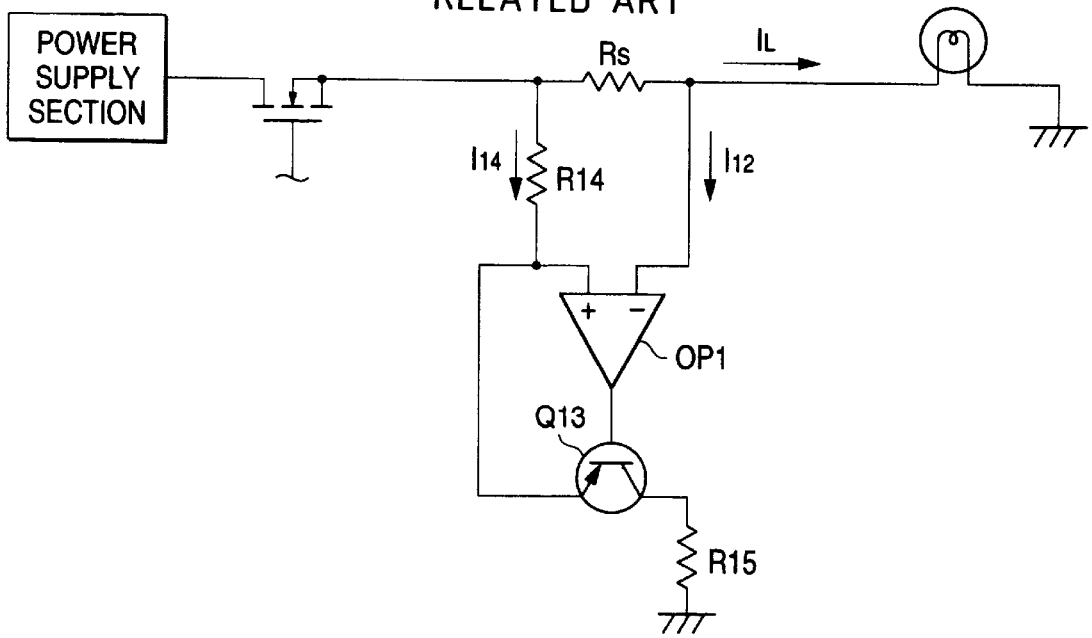
FIG. 11 is a circuit diagram to show an example of a current detection circuit in another related art.

In FIG. 3B, the minimum value and the maximum value of (IL)/(VOUT) in the circuit in FIG. 1 are 23.4 an 24.8 respectively, and the minimum value and the maximum value of (IL)/(VOUT) in the circuit in FIG. 10 are 19.8 an 23.75 respectively.

That is, variation of (IL)/(VOUT) is placed within ±3% in the circuit in FIG. 1, while variation of ±9% occurs in the circuit in FIG. 10. Therefore, to use the circuit in FIG. 10 to detect an area with a small load current with good accuracy, the resistance value of the resistor R12 in FIG. 10 needs to be changed, but need not be changed in the circuit in FIG. 1.

As described above, according to the embodiment, when the circuit is started, the bases of the transistors Q1 and Q2 are grounded through the switch means 10, whereby the route where the base current flows is forcibly provided, so that the circuit operation at the starting time can be made reliable. That is, according to the embodiment, in the structure wherein the first current mirror circuit 7 and the second current mirror circuit 8 are simply connected, the circuit operation is realized based on the internal structure (parasitic capacitance) of each of the actual transistors and the stable operation is not reliably performed depending on the combination of the transistors and the circuit constants and a malfunction caused by noise, temperature change, etc., (circuit stop caused by parasitic capacitance change, etc., also occurs; however, according to the embodiment, the problems can be resolved.

The transistor Q1 is connected to the power supply section 1 side of the shunt resistor Rs via the resistor R1, the transistor Q2 is connected to the load 4 side of the shunt resistor Rs, and the transistors Q3 and Q4 making up the second current mirror circuit 8 are connected to the transistors Q1 and Q2, whereby a part of the load current IL is shunted with good accuracy and the output end of the shunted current is grounded via the resistor R2, so that the voltage proportional to the load current IL can be provided with good accuracy and the load current IL can be found with good accuracy accordingly.

Figure 4:
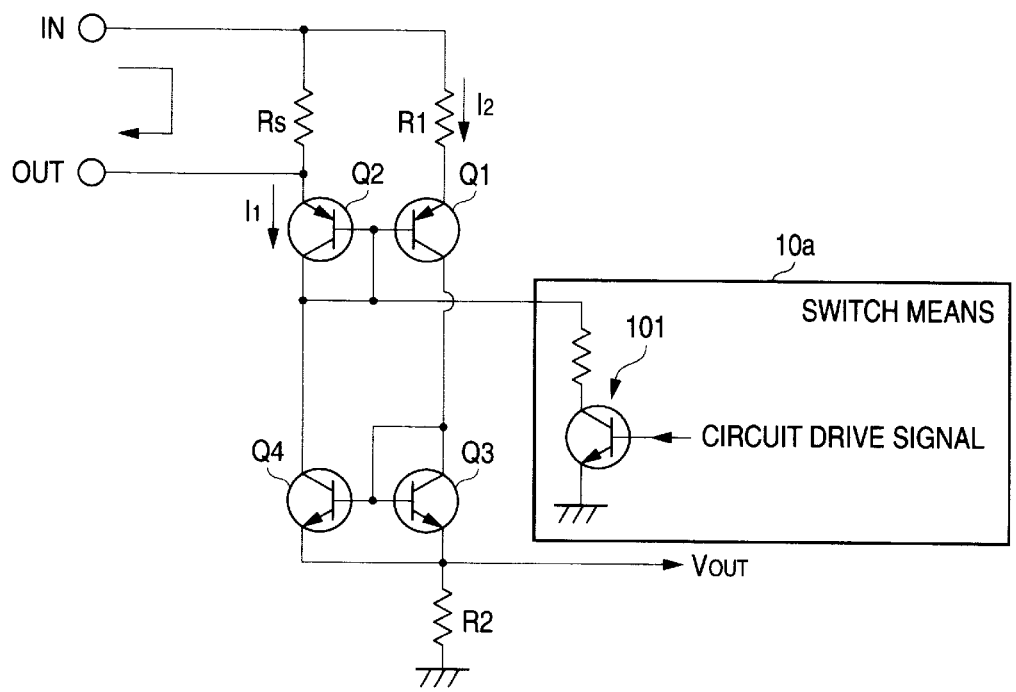
FIG. 4 is a circuit diagram to show another configuration example of the switch means in FIG. 1.

The invention is not limited to the above-described embodiment and the following modifications can be adopted:

(1) In the above-described embodiment, when the power is turned on, the control means 11 outputs a trigger signal to the one-shot pulse generation circuit 102 for turning on the transistor circuit 101, but the control means 11 may output a circuit drive pulse signal for turning on the transistor circuit 101 only for a predetermined time when the power is turned on directly to the transistor circuit 101, as shown in FIG. 4, without providing the one-shot pulse generation circuit 102. In this case, only the transistor circuit 101 forms switch means 10a.

Figure 5:
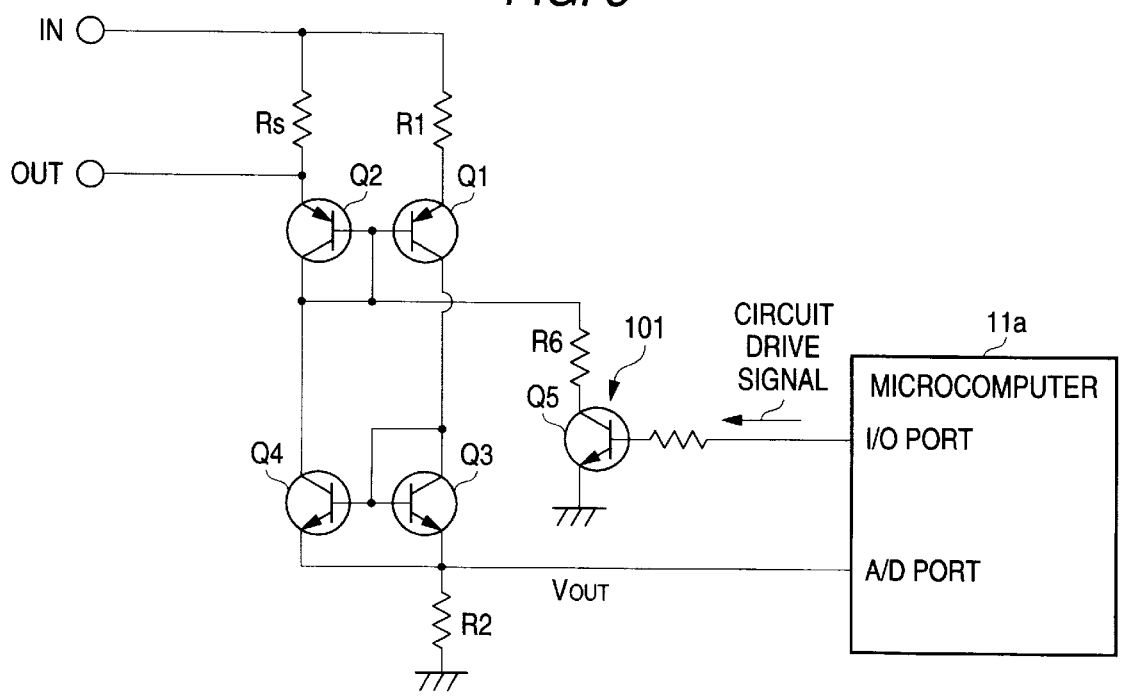
FIG. 5 is a circuit diagram to show another configuration example of the switch means and voltage detection circuit in FIG. 1.

(2) In the above-described embodiment, the one-shot pulse generation circuit 102 and the control means 11 for turning on the transistor circuit 101 only for the predetermined time and further the voltage detection circuit 9 are provided, but these functions can also be provided by a microcomputer 11a as shown in FIG. 5. In this case, the transistor Q8 is once operated by a circuit drive signal from an I/O port and after the transistor Q8 is turned off in a given time, the output voltage VOUT can also be read through an A/D port under the control of the microcomputer 11a. In the circuit configuration, the A/D port does not continuously read the voltage value and reads the voltage value every constant period, so that the transistor Q8 can also be turned on/off every period while the voltage value is not read. If the current voltage conversion circuit made up of the current mirror circuits malfunctions and stops due to noise, etc., as in the embodiment wherein the transistor Q8 is turned on and off only once when the circuit is started, the transistor Q8 is turned on and off every constant time and the current mirror circuit is forcibly started, so that the modification has the advantage that the current mirror circuit has resistance to noise. In this case, the microcomputer 11a contains the functions of the above-described voltage detection means, the current value detection means for calculating and finding the load current IL from the detected voltage value, and the load current determination means for determining whether or not the found load current IL is within the normal range. In current value calculation means, calculation is executed based on the above-described principle of finding the load current IL from the output voltage VOUT.

Figure 6:
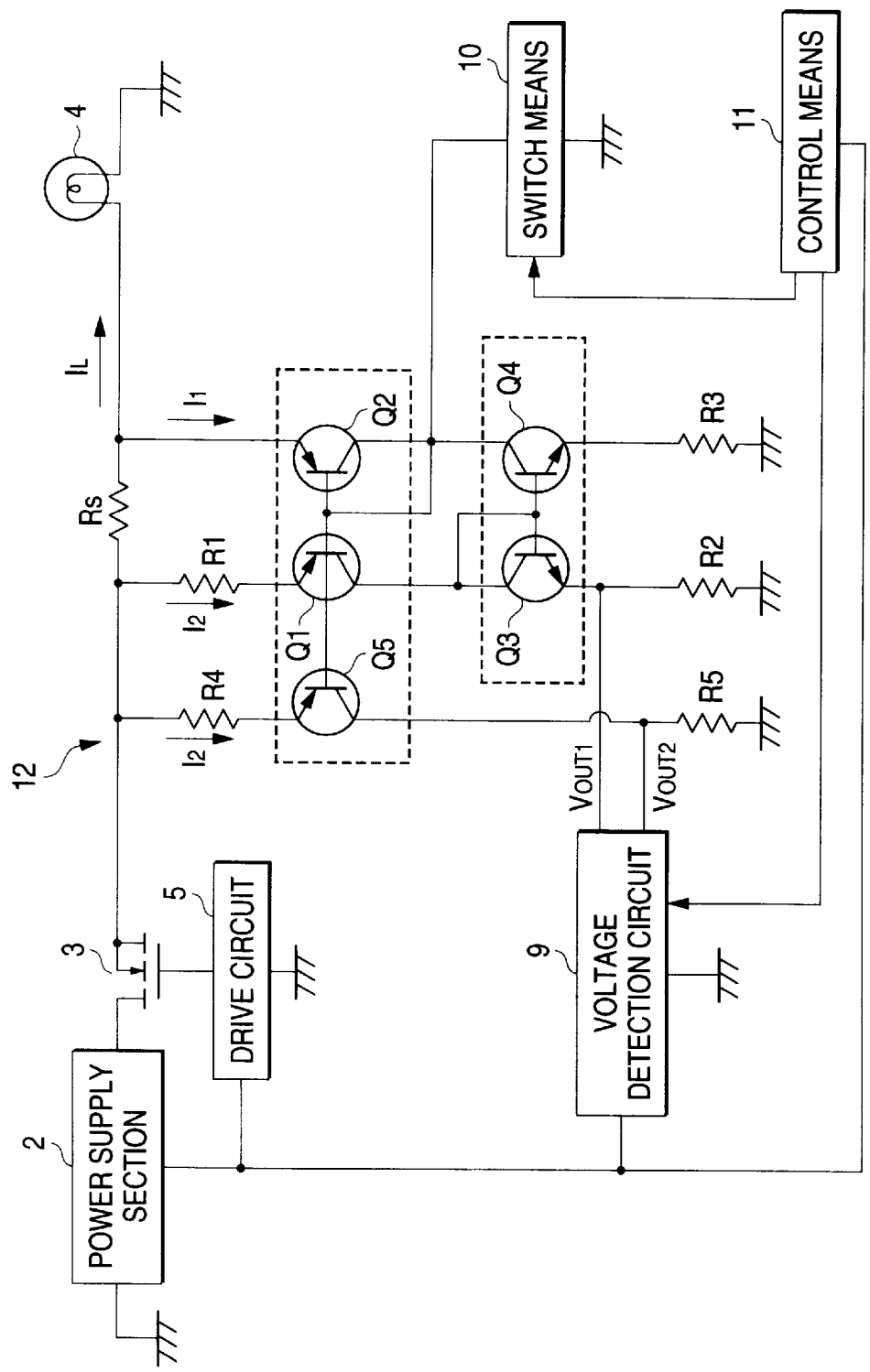
FIG. 6 is a circuit diagram to show one modification of the current detector in FIG. 1.

(3) FIG. 6 is a circuit diagram to show one modification of the current detector previously described with reference to FIG. 1. Parts identical with those previously described with reference to FIG. 1 are denoted by the same reference numerals in FIG. 6. In FIG. 6, a current detector 12 comprises a resistor R3 having a resistance value R2 (third resistance element), a resistor R4 having a resistance value R1 (fourth resistance element), a resistor R5 having a resistance value R5 (R5≠R2) (fifth resistance element), and a transistor Q5 of a pnp transistor with the base-emitter voltage almost equal to that of a transistor Q1 (fifth transistor) in addition to the components of the current detector in FIG. 1.

An emitter of a transistor Q4 is not connected to an emitter of a transistor Q3 and is grounded via a resistor R3.

Therefore, in the circuit in FIG. 6, an output voltage VOUT1 from the emitter of the transistor Q3 becomes
(Expression 14)

$$VOUT1 = R2 \cdot IL/(N-1)$$

The transistor Q5 has an emitter connected to the power supply section 1 side of a shunt resistor Rs via the resistor R4, a base connected to a base of a transistor Q1, and a collector grounded via the resistor R5. A voltage detection circuit 9 further detects a voltage value VOUT2 of the collector of the transistor Q5 and finds a load current IL from the detected voltage value.

In the circuit in FIG. 6, the resistors R1 and R4 have equal resistance values R1 and the transistor Q5 has the same characteristic as the transistor Q1, so that a current I2 equal to that of the transistor Q1 flows into the transistor Q5 as shown in FIG. 6.

Therefore, the output voltage VOUT2 from the collector of the transistor Q5 becomes
(Expression 15)

$$VOUT2 = R5 \cdot IL/(N-1)$$

According to the modification, connection is made to the FET 3 side of the shunt resistor Rs via the resistor R4 of the same resistance value as the resistor R1, the transistor Q5 having the same characteristic as the transistor Q1 is provided, and the resistance value of the collector resistor R5 is set to a proper value different from the resistance value of the resistor R2, whereby the voltages VOUT1 and VOUT2 at different levels can be output at the same time to the load current IL at the same level.

Therefore, if the voltage range that can be detected by the voltage detection circuit 9 is narrow as compared with the change range of the output voltage VOUT caused by change in the load current IL, the load current IL can be detected suitably with good accuracy.

Figure 7:
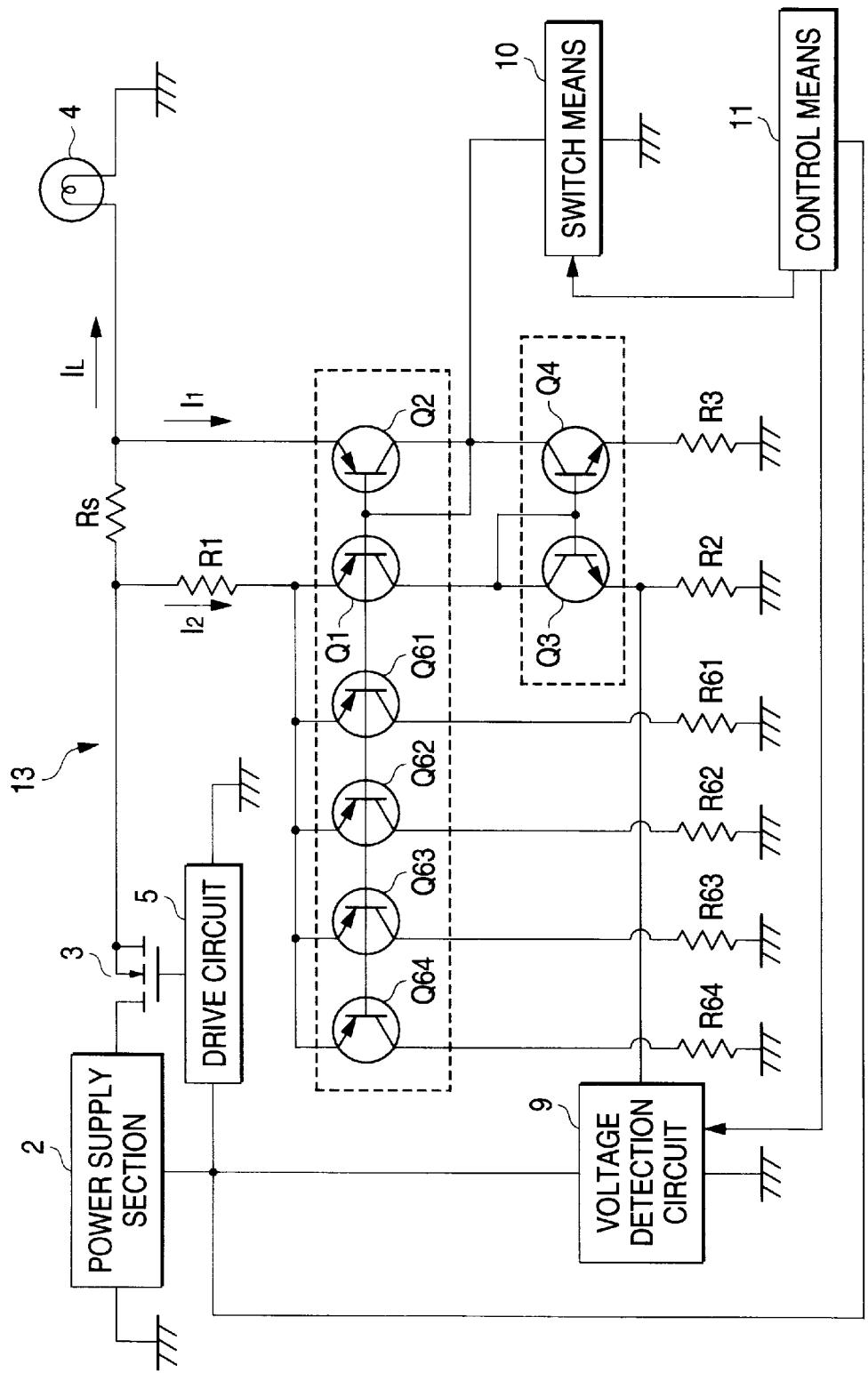
FIG. 7 is a circuit diagram to show another modification of the current detector in FIG. 1.

(4) FIG. 7 is a circuit diagram to show another modification of the current detector previously described with reference to FIG. 1. Parts identical with those previously described with reference to FIG. 1 are denoted by the same reference numerals in FIG. 7. In FIG. 7, a current detector 13 comprises a resistor R3 having a resistance value R2 (third resistance element), resistors R61 to R64 each having a resistance value R2 (sixth resistance elements), and pnp transistors Q61 to Q64 each with the base-emitter voltage almost equal to that of a transistor Q1 in addition to the components of the current detector in FIG. 1.

An emitter of a transistor Q4 is not connected to an emitter of a transistor Q3 and is grounded via a resistor R3. The pnp transistors Q61 to Q64 have emitters connected to an emitter of the transistor Q1, bases connected to a base of the transistor Q1, and collectors grounded via the resistors R61 to R64.

According to the modification, the currents flowing into the resistor R2 and the resistors R61 to R64 become equal levels to each other and thus become each I1/5, so that a voltage detection circuit 9 can be made up of circuit parts consuming low power and the circuit can be miniaturized and the costs can be reduced.

The modification in FIG. 7 comprises the four resistors R61 to R64 and the four pnp transistors Q61 to Q64, but the number of parts is not limited to four and may be a predetermined number M. Thus, the currents flowing into the M resistors and the resistor R2 become I1/(M+1) and the power consumption can be reduced.

In the modification, the characteristics of the transistors Q1, Q2, and Q61 to Q64 need to be matched with each other to detect a load current IL with good accuracy, thus preferably the transistor circuit is implemented as an IC uniformly.

Here, variations in characteristics of elements in an integrated circuit (IC) formed on a semiconductor wafer will be discussed.

To manufacture ICs, a large number of identical circuits are formed by executing a known circuit formation process on one of wafers cut out from a semiconductor (generally, silicon) ingot, then the wafer is diced and molded for each circuit (chip).

Therefore, the variations in characteristics of the elements in IC can be classified into those occurring between the chips in one wafer, those between the wafers, and those between ingots from which wafers are cut out.

The variations in characteristics of the elements in IC are caused by variations in the circuit formation process, namely, variations in etching process, variations in exposure process, variations in diffusion degree in impurity diffusion process, variations in temperature in each process, etc.

The etching process, the exposure process, and the impurity diffusion process causing the variations are executed for each wafer and the temperature of each process is also the same with the same wafer, thus the variations in characteristics are hard to occur between the chips in one wafer. Particularly, the variations between the elements formed close to each other in the same chip can be almost ignored.

Therefore, relative variations in characteristics of the transistors Q1, Q2, and Q61 to Q64, relative variations in characteristics of the transistors Q3 and Q4, and relative variations in resistance values of the resistors R2, R3, and R61 to R64 can be placed at very low levels.

Figure 8:
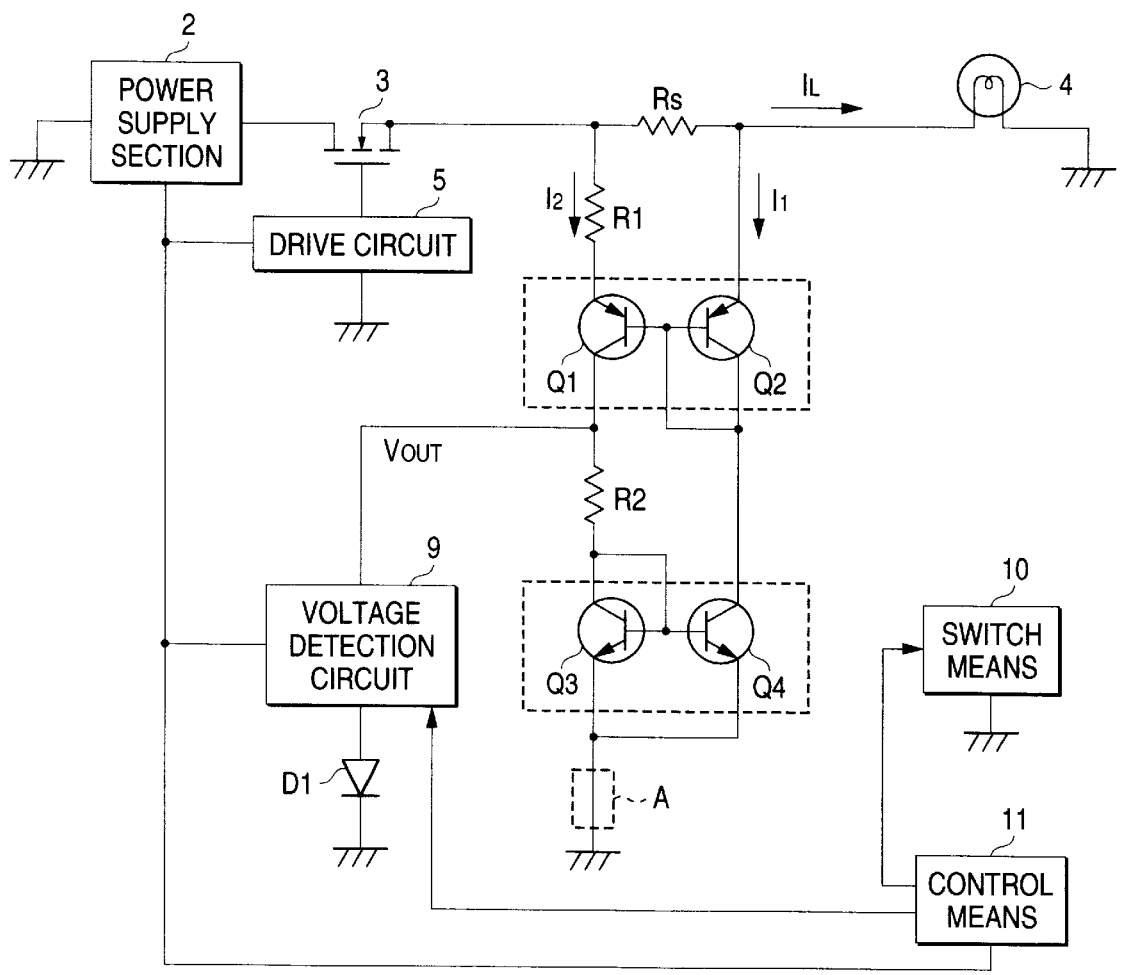
FIG. 8 is a circuit diagram to show still another modification of the current detector in FIG. 1.

(5) FIG. 8 is a circuit diagram to show still another modification of the current detector previously described with reference to FIG. 1. Parts identical with those previously described with reference to FIG. 1 are denoted by the same reference numerals in FIG. 8. In FIG. 8, a voltage detection circuit 9 is grounded via a diode D1 of a rectification element, whereby when a power supply section 2 made of a battery is connected to the circuit, for example, if the positive and negative poles are connected oppositely in error, the internal circuit of the voltage detection circuit 9 can be protected. However, in the circuit configuration, the voltage detected by the voltage detection circuit 9 is raised as much as the forward voltage of the diode D1.

Then, in the modification in FIG. 8, the connection position of a resistor R2 is changed from that in FIG. 1 and the voltage detection point of the voltage detection circuit 9 is also changed. That is, the resistor R2 is placed between collectors of transistors Q1 and Q3 and the collector of the transistor Q1 is connected to the voltage detection circuit 9.

Thus, an output voltage VOUT is raised by the base-emitter voltage of the transistor Q3 equal to the forward voltage of the diode D1, so that a load current IL can be detected suitably with good accuracy, as in the first embodiment.

Only the voltage detection point of the voltage detection circuit 9 may be changed from that in FIG. 1 and the connection position of the resistor R2 may remain at the same position as that in FIG. 1, namely, the position of block A indicated by the dashed line in FIG. 8. Also in this case, likewise, the output voltage VOUT is raised by the base-emitter voltage of the transistor Q3. Since the resistor R2 is connected between emitters of transistors Q3 and Q4 and ground, a current mirror circuit made up of the transistors Q3 and Q4 can be operated suitably as compared with the modification in FIG. 8.

Figure 9:
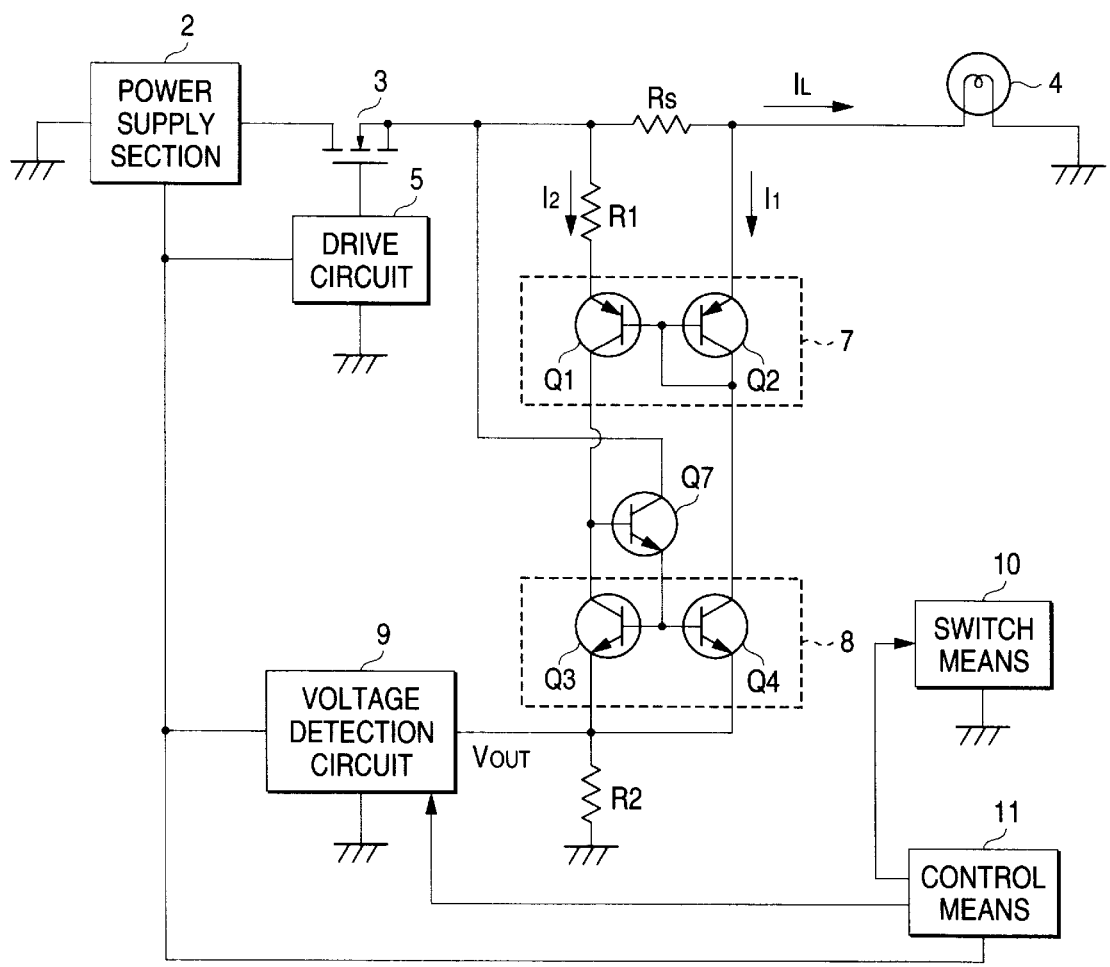
FIG. 9 is a circuit diagram to show another modification of the current detector in FIG. 1.

(6) In the embodiment previously described with reference to FIG. 1, the collector and the base of the transistor Q3 are directly connected; instead, an npn transistor Q7 may be provided as shown in FIG. 9. That is, the transistor Q7 has a base connected to the collector of the transistor Q3, an emitter connected to the base of the transistor Q3, and a collector connected to the FET 3 side of a shunt resistor Rs.

According to the modification, the decrease drawn out from the collector current of the transistor Q3 becomes 1/hFE, so that the characteristics of the current mirror circuit made up of the transistors Q3 and Q4 can be improved.

(7) In the embodiment and the modifications described above, the loads 4 are lamps as shown in FIGS. 1 and 6 to 9, but not limited to lamps. For example, a secondary battery is adopted, whereby the charge current as supply current supplied from a power supply section to the secondary battery can be detected with good accuracy and the charge amount of the secondary battery can be found with good accuracy.

As described above, according to the invention as claimed in claim 1, 2, when the circuit is activated, the control terminals of the transistors making up the first current mirror circuit are grounded through the switch means, whereby a current is forcibly made to flow into the control terminals, so that the circuit operation can be made reliable at the activation time. A part of load current is shunted with good accuracy via the first resistance element having the first resistance value of the predetermined magnification of the resistance value of the current detection resistor, the first current mirror circuit, and the second current mirror circuit, and the output end of the shunted current is grounded via the second resistance element having the second resistance value, so that an output voltage proportional to the load current can be obtained with good accuracy from the second resistance element and the load current can be found with good accuracy from the output voltage.

According to the invention as claimed in claim 3, the switch means for grounding the control terminals of the transistors of the first current mirror circuit can be easily implemented as transistor circuit.

Further, according to the invention as claimed in claim 4, a one-shot pulse from the one-shot pulse generation circuit can be used easily to turn off the transistor circuit after turning on the transistor circuit only for a predetermined time.

Further, according to the invention as claimed in claim 5, the control means controls so as to output a current detection start signal to the voltage detection means after on/off control of the switch means is performed, so that the voltage detection timing can be taken reliably and well.

Further, according to the invention as claimed in claim 6, on/off control of the switch means is performed every constant period. Thus, if the current voltage conversion circuit made up of the first and second current mirror circuits malfunctions and stops due to noise, etc., for example, it is again activated in the next period and the detected voltage can always be monitored. Therefore, noise resistance of the first and second current mirror circuits can be enhanced.

Further, according to the invention as claimed in claim 7, the first and second current mirror circuits can be configured easily.

Further, according to the invention as claimed in claim 8, if the voltage range that can be detected by the voltage detection means is narrow as compared with the change range of the detected voltage caused by change in the load current, the load current can be found suitable with good accuracy. Also in this case, the circuit operation can be made reliable at the activation time by the switch means.

Further, according to the invention as claimed in claim 9, the currents flowing into the second resistance element and the sixth resistance elements become equal levels to each other, so that the voltage detection means can be made up of circuit parts consuming low power and the circuit can be miniaturized and the costs can be reduced. Also in this case, the circuit operation can be made reliable at the activation time by the switch means.

What is claimed is:

1. A current detector using a current detection resistor placed between a power supply section and a load to detect a supply current value supplied from said power supply section to said load, said current detector comprising:

a first resistance element having a first resistance value of a predetermined magnification of a resistance value of said current detection resistor, a first current mirror circuit made up of a plurality of negative-polarity-type transistors, and having one end connected to an end part of said current detection resistor on said power supply section side thereof via said first resistance element and an opposite end connected to an end part of said current detection resistor on said load side thereof, a second current mirror circuit made up of a plurality of positive-polarity-type transistors and having both input ends connected to both output ends of said first current mirror circuit, a second resistance element placed between at least either of both output ends of said second current mirror circuit and ground, and having a second resistance value, current detection means for detecting a voltage of said second resistance element on said second current mirror circuit side thereof, and switch means placed between control terminals of said transistors making up said first current mirror circuit and ground.

2. The current detector as claimed in claim 1, further comprising:

current value detection means using the detected voltage to find the supply current value.

3. The current detector as claimed in claim 2, wherein said switch means comprises: a transistor circuit capable of grounding the control terminal of said transistor.

4. The current detector as claimed in claim 2, further comprising: control means for controlling so that said voltage detection means detects the voltage after on/off control of said switch means is performed.

5. The current detector as claimed in claim 2, wherein said first current mirror circuit comprises: a first transistor having an emitter connected to said power supply section side of said current detection resistor via said first resistance element, and a second transistor having an emitter connected to said load side of said current detection resistor and a base and a collector connected to a base of a said first transistor, said first and second transistors being implemented as pnp transistors, wherein said second current mirror circuit comprises: a third transistor having a collector connected to a collector of said first transistor, and a fourth transistor having a collector connected to the collector of said second transistor and a base connected to a base and the collector of said third transistor, said third and fourth transistors being implemented as npn transistors, and wherein an emitter of at least either of said third and fourth transistors is grounded via said second resistance element.

6. The current detector as claimed in claim 1, wherein said switch means comprises: a transistor circuit capable of grounding the control terminal of said transistor.

7. The current detector as claimed in claim 6, wherein said switch means comprises: a one-shot pulse-generation circuit for activating said transistor circuit.

8. The current detector as claimed in claim 7, further comprising: control means for controlling so that said voltage detection means detects the voltage after on/off control of said switch means is performed.

9. The current detector as claimed in claim 4, wherein said first current mirror circuit comprises: a first transistor having an emitter connected to said power supply section side of said current detection resistor via said first resistance element, and a second transistor having an emitter connected to said load side of said current detection resistor and a base and a collector connected to a base of a said first transistor, said first and second transistors being implemented as pnp transistors, wherein said second current mirror circuit comprises: a third transistor having a collector connected to a collector of said first transistor, and a fourth transistor having a collector connected to the collector of said second transistor and a base connected to a base and the collector of said third transistor, said third and fourth transistors being implemented as npn transistors, and wherein an emitter of at least either of said third and fourth transistors is grounded via said second resistance element.

10. The current detector as claimed in claim 6, further comprising: control means for controlling so that said voltage detection means detects the voltage after on/off control of said switch means is performed.

11. The current detector as claimed in claim 6, wherein said first current mirror circuit comprises: a first transistor having an emitter connected to said power supply section side of said current detection resistor via said first resistance element, and a second transistor having an emitter connected to said load side of said current detection resistor and a base and a collector connected to a base of a said first transistor, said first and second transistors being implemented as pnp transistors, wherein said second current mirror circuit comprises: a third transistor having a collector connected to a collector of said first transistor, and a fourth transistor having a collector connected to the collector of said second transistor and a base connected to a base and the collector of said third transistor, said third and fourth transistors being implemented as npn transistors, and wherein an emitter of at least either of said third and fourth transistors is grounded via said second resistance element.

12. The current detector as claimed in claim 1, further comprising:
control means for controlling so that said voltage detection means detects the voltage after on/off control of said switch means is performed.

13. The current detector as claimed in claim 12, wherein said control means controls so as to detect-the voltage every constant period, and performs on/off control of said switch means every constant period while the voltage is not detected.

14. The current detector as claimed in claim 13, wherein said first current mirror circuit comprises: a first transistor having an emitter connected to said power supply section side of said current detection resistor via said first resistance element, and a second transistor having an emitter connected to said load side of said current detection resistor and a base and a collector connected to a base of a said first transistor, said first and second transistors being implemented as pnp transistors, wherein said second current mirror circuit comprises: a third transistor having a collector connected to a collector of said first transistor, and a fourth transistor having a collector connected to the collector of said second transistor and a base connected to a base and the collector of said third transistor, said third and fourth transistors being implemented as npn transistors, and wherein an emitter of at least either of said third and fourth transistors is grounded via said second resistance element.

15. The current detector as claimed in claim 12, wherein said first current mirror circuit comprises: a first transistor having an emitter connected to said power supply section side of said current detection resistor via said first resistance element, and a second transistor having an emitter connected to said load side of said current detection resistor and a base and a collector connected to a base of a said first transistor, said first and second transistors being implemented as pnp transistors, wherein said second current mirror circuit comprises: a third transistor having a collector connected to a collector of said first transistor, and a fourth transistor having a collector connected to the collector of said second transistor and a base connected to a base and the collector of said third transistor, said third and fourth transistors being implemented as npn transistors, and wherein an emitter of at least either of said third and fourth transistors is grounded via said second resistance element.

16. The current detector as claimed in claim 1, wherein said first current mirror circuit comprises:
a first transistor having an emitter connected to said power supply section side of said current detection resistor via said first resistance element, and
a second transistor having an emitter connected to said load side of said current detection resistor,and a base and a collector connected to a base of said first transistor, said first and second transistors being implemented as pnp transistors, wherein
said second current mirror circuit comprises:
a third transistor having a collector connected to a collector of said first transistor, and
a fourth transistor having a collector connected to the collector of said second transistor and a base connected to a base and the collector of said third transistor, said third and fourth transistors being implemented as npn transistors, and wherein
an emitter of at least either of said third and fourth transistors is grounded via said second resistance element.

17. The current detector as claimed in claim 16, further comprising:
a third resistance element having the second resistance value,
a fourth resistance element having the same resistance value as said first resistance element, and
a fifth resistance element having a resistance value different from the second resistance value, wherein
said first current mirror circuit further includes:
a fifth transistor of a pnp transistor having an emitter connected to said power supply section side of said current detection resistor via said fourth resistance element and a base connected to the base of said first transistor, and wherein
said third transistor has the emitter grounded via said second resistance element,
said fourth transistor has the emitter grounded via said third resistance element, and said fifth transistor has a collector grounded via said fifth resistance element, and wherein said voltage detection means further detects a voltage value of the collector of said fifth transistor.

18. The current detector as claimed in claim 16, further comprising:

a predetermined number of sixth resistance elements each having the second resistance value, wherein said first current mirror circuit has the predetermined number of sixth transistors of pnp transistors having emitters connected to the emitter of said first transistor and bases connected to the base of said first transistor, and wherein collectors of the sixth transistors are grounded via said sixth resistance elements.

* * * * *